United States Patent
Shoga

(10) Patent No.: US 6,583,493 B1
(45) Date of Patent: Jun. 24, 2003

(54) SINGLE EVENT UPSET HARDENING TECHNIQUE FOR BIPOLAR DEVICES

(75) Inventor: Munir Shoga, Laguna Niguel, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/488,193

(22) Filed: Jan. 20, 2000

(51) Int. Cl.$^7$ ................................. H01L 31/11
(52) U.S. Cl. ........................ 257/565; 257/621
(58) Field of Search ................ 257/197, 565, 257/583, 621

(56) References Cited

U.S. PATENT DOCUMENTS

| | | | | |
|---|---|---|---|---|
| 6,049,119 A | * | 4/2000 | Smith | 257/575 |
| 6,218,895 B1 | * | 4/2002 | De et al. | 327/566 |
| 6,407,444 B1 | * | 6/2002 | Shoga | 257/621 |

* cited by examiner

Primary Examiner—John F. Niebling
Assistant Examiner—Christopher Lattin
(74) Attorney, Agent, or Firm—Terje Gudmestad

(57) ABSTRACT

A bipolar device hardened against single event upset includes a voltage source, a substrate, and a surface contact. The substrate includes a first collector region, a first base region and a first emitter region. The first collector region has a first collector voltage and a first voltage threshold. The first voltage threshold is the voltage at which a bipolar device connected to the first collector or first emitter becomes upset. When the first collector voltage drops below the first voltage threshold, the attached bipolar device becomes upset. The first base region is adjacent to the first collector region and the first emitter region is adjacent to the first base region. The surface contact is disposed on the substrate and is coupled to a voltage bias generated by the voltage source. The voltage bias is greater then the first voltage threshold so that the first collector voltage is prevented from dropping below the first voltage threshold due to energetic particle induced charge.

10 Claims, 2 Drawing Sheets

SINGLE EVENT UPSET HARDENING TECHNIQUE FOR BIPOLAR DEVICES

TECHNICAL FIELD

The present invention relates generally to bipolar devices, and more particularly, to a single event upset hardening technique for bipolar devices.

BACKGROUND ART

Satellites and other spacecraft are in widespread use for various purposes including scientific research and communications. These scientific and communications missions, however, cannot be accurately fulfilled without maintaining electronic data integrity. In many applications, the satellite relies upon electronic data to perform attitude and position corrections, diagnostic status checks, communication calculations and other functions. Without accurate electronic data, proper satellite function is hindered and at times adversely effected.

Integrated circuits (IC's) used in computers and other electronic systems aboard space vehicles are susceptible to a phenomenon known as Single Event Upset, or SEU. Single Event Upset occurs when energetic particles, such as cosmic radiation, pass through an integrated circuit depositing stray charges in the device, causing one of its registers to be disrupted. This disruption may result in one or more data errors.

Several fault protection techniques, such as redundancy and error detection and correction, can be utilized to reduce the number of SEU's that occur in the integrated circuits used aboard space vehicles. One technique is to increase the size of the registers, as a larger register requires a greater amount of stray charge for an SEU to occur. However, the resistance to Single Event Upset only increases linearly with area. Therefore, a rather large tenfold increase in the area of a register only improves the resistance to upset by ten times. This is in direct contrast to the current trend in technology, which is constantly reducing size and voltage required for electronic devices.

The disadvantages associated with these conventional single event upset fault protection techniques, such as limited use and/or cost penalties, have made it apparent that a new technique for hardening bipolar devices against single event upset faults is needed. The present invention is directed to these ends.

SUMMARY OF THE INVENTION

It is, therefore, an object of the invention to provide an improved and reliable single event upset hardening technique for bipolar devices. Another object of the invention is to reduce the charge collected in a bipolar device caused by energetic particles.

In one embodiment of the invention, a bipolar device hardened against single event upset includes a voltage source, a substrate, and a surface contact. The substrate includes a first collector region, a first base region and a first emitter region. The first collector region has a first collector voltage and a first voltage threshold. The first voltage threshold is the voltage at which a bipolar device connected to the first collector or first emitter becomes upset. When the first collector voltage drops below the first voltage threshold, the attached bipolar device becomes upset. The first base region is adjacent to the first collector region and the first emitter region is adjacent to the first base region. The surface contact is disposed on the substrate and is coupled to a voltage bias generated by the voltage source. The voltage bias is greater then the first voltage threshold so that the first collector voltage is prevented from dropping below the first voltage threshold due to energetic particle induced charge.

The present invention thus achieves an improved single event upset hardening technique for bipolar devices. The present invention is advantageous in that a single contact may be used to harden several bipolar devices.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

BEST MODES FOR CARRYING OUT THE INVENTION

Figure 1:
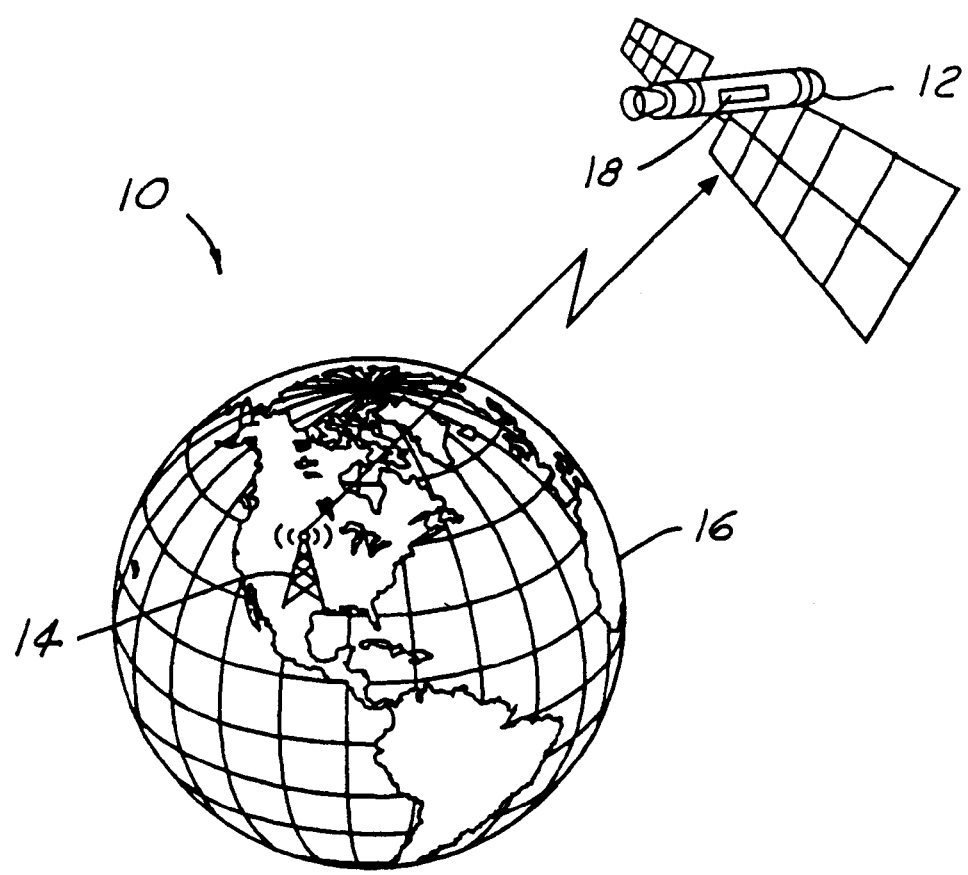
FIG. 1 is a perspective view of a satellite system hardened against single event upset in accordance with a preferred embodiment of the present invention.

Referring to FIG. 1, a perspective view of a satellite system hardened against single event upset 10 in accordance with a preferred embodiment of the present invention is illustrated. The satellite system hardened against single event upset 10 is comprised of one or more satellites 12 in communication with a ground station 14 located on the Earth 16. Each satellite 12 contains one or more bipolar devices hardened against single event upsets 18.

Integrated circuits used in computers and other electronic systems aboard space vehicles are susceptible to a phenomenon known as Single Event Upset, or SEU. Single Event Upset occurs when energetic particles, such as cosmic radiation pass through an integrated circuit deposits stray charges in the device, causing one of its registers to be disrupted. This disruption may result in one or more data errors. The satellite system hardened against single event upset 10 is responsible for ensuring the integrity of electronic data despite being subjected to energetic particles.

Figure 2:
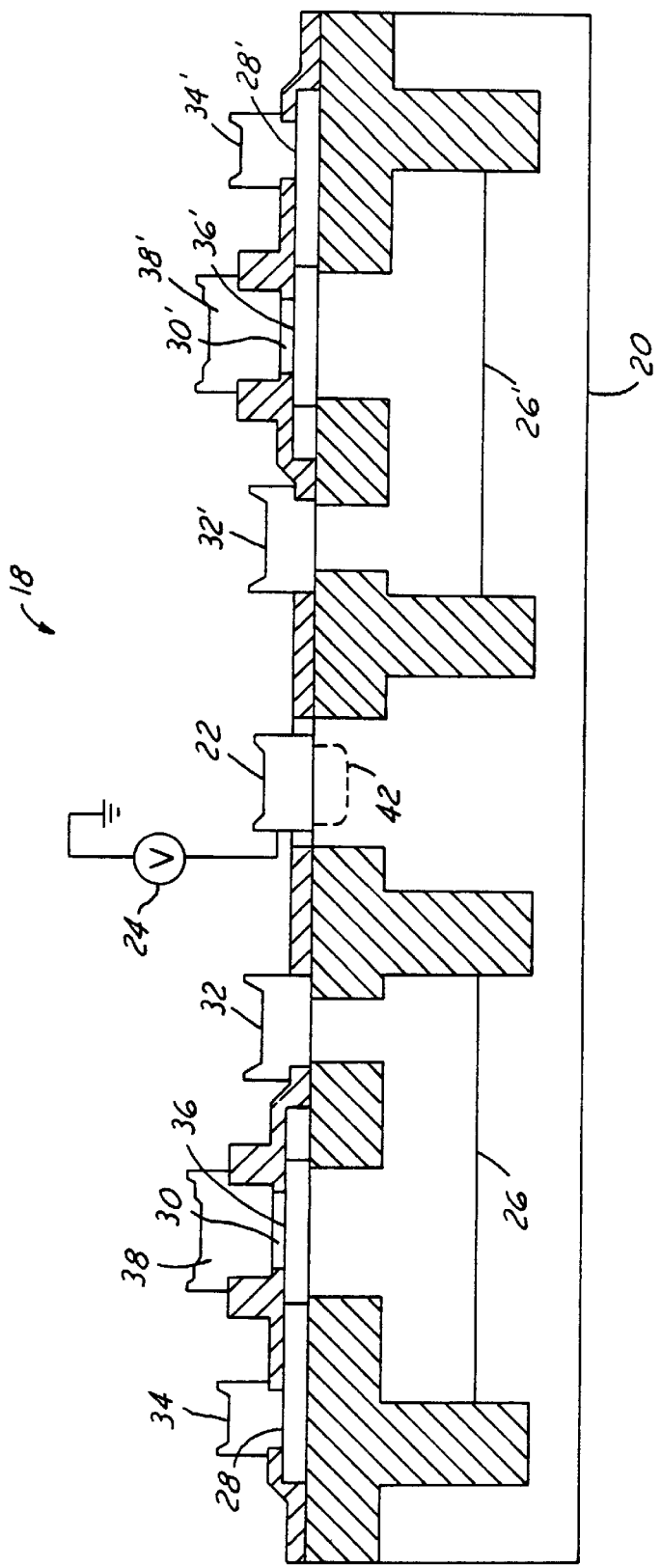
FIG. 2 is a cross section of a bipolar device hardened against single event upset in accordance with a preferred embodiment of the present invention.

Referring to FIG. 2, a cross section of a bipolar device hardened against single event upset 18 in accordance with a preferred embodiment of the present invention is illustrated. The bipolar device includes a substrate 20 and a surface contact 22 coupled to a voltage source 24.

Substrate 20 includes a first collector region 26, a first base region 28, and a first emitter region 30. First collector region 26 has a first collector voltage and a first voltage threshold. The first voltage threshold is the voltage at which a bipolar device connected to the first collector 26 becomes upset. When the first collector voltage drops below the first voltage threshold (due to charge build up from energetic particles), the attached bipolar device becomes upset. First collector region 26 is coupled to a metal contact 32 for integration into an electronic circuit and may be either p or n doped.

First base region 28 is formed in substrate 20 and is adjacent to first collector region 26. First base region 28 is coupled to a metal contact 34 and may be either p or n doped (opposite collector region 26). In another aspect of the invention, first base region 28 includes an epitaxial region 36 located between first collector region 26 and first emitter region 30. Epitaxial region 36 may be made of silicon or a heterojunction material, such as Germanium, to improve the performance of bipolar device 18.

First emitter region 30 is formed in substrate 20 and is adjacent to first base region 28. First emitter region 30 has a first emitter voltage and a first emitter voltage threshold. The first emitter voltage threshold is the voltage at which a bipolar device connected to the first emitter 30 becomes upset. When the first emitter voltage drops below the first emitter voltage threshold (due to charge build up from energetic particles), the attached bipolar device becomes upset. First emitter region 30 is coupled to a metal contact 38 and may be either p or n doped (opposite base region 28). Substrate 20 also includes one or more isolation regions 40 for isolating bipolar device 18 from each other in an integrated circuit.

If an additional bipolar device is desired, then substrate 20 may contain a second collector region 26' located a first distance from first collector region 26. The second collector region 26' has a second collector voltage and a second voltage threshold. The second voltage threshold is the voltage at which a bipolar device connected to the second collector 26' becomes upset. When the second collector voltage drops below the second voltage threshold (due to charge build up from energetic particles), the attached bipolar device becomes upset. Similarly, a second base region 28' is formed in substrate 20 and is adjacent to the second collector region 26' and a second emitter region 30' is formed in substrate 20 and is adjacent to the second base region 28'.

Surface contact 22 is disposed on substrate 20 and is coupled to a voltage source 24. Preferably, substrate 20 includes a surface substrate tie 42 disposed under surface contact 22 to improve electrical performance. Voltage source 24 generates a voltage bias greater then the first voltage threshold so that the first collector voltage is prevented from dropping below the first voltage threshold due to energetic particle induced charge. Alternatively, voltage source 24 may generate a voltage bias greater then the first emitter voltage threshold so that the first emitter voltage is prevented from dropping below the first emitter voltage threshold due to energetic particle induced charge. Ideally, the voltage bias should not forward bias the bipolar device coupled to first collector 26 or first emitter 30. The role of the voltage bias is to (1) reduce the charge collected in first collector region 26 by reducing the charge collection region, i.e., reducing the collector-substrate junction width, and (2) prevent the collector voltage from dropping below the voltage that will cause an upset.

Several bipolar devices having similar voltage thresholds may share one surface contact. In the case of adding an additional bipolar device, surface contact 22 is positioned between first collector region 26 and the second collector region. Voltage source 24 generates a voltage bias greater than the second voltage threshold so that the second collector voltage is prevented from dropping below the second voltage threshold due to energetic particle induced charge.

Single event upset hardening is, therefore, accomplished in two ways: (1) reducing the charge collection in first collector region 26 thus improving the Linear Transfer Energy (LET) threshold for upset and reducing the sensitive area of bipolar device 18. (2) Preventing the first collector or emitter voltage from dropping below the voltage that will turn on the next stage circuit, i.e., upsetting it.

When applying the present invention, the first step in hardening a circuit against single event upset begins by designing a circuit using bipolar devices. After the circuit is designed, the nodal voltages for said bipolar devices are determined using SPICE or some other simulation program. Once the nodal voltages are determined, the threshold voltages for when the bipolar devices become upset are determined. Bipolar devices having similar threshold voltages are then positioned in the circuit so those similar bipolar devices may share one surface contact. For large circuit applications, each surface contact is coupled to a pin. Finally, bias voltages equivalent to the threshold voltages are applied to each surface contact, which guarantees the hardness of the device.

From the foregoing, it can be seen that there has been brought to the art a new and improved single event upset hardening technique for bipolar devices. It is to be understood that the preceding description of the preferred embodiment is merely illustrative of some of the many specific embodiments that represent applications of the principles of the present invention.

Clearly, numerous and other arrangements would be evident to those skilled in the art without departing from the scope of the invention as defined by the following claims:

1. A bipolar device hardened against single event upset having a voltage source, said bipolar device comprising:

a substrate having a first collector region formed therein, said first collector region having a first collector voltage and a first voltage threshold, whereby when said first collector voltage drops below said first voltage threshold an attached bipolar device becomes upset, said substrate having a first base region formed therein and adjacent to said first collector region, said substrate having a first emitter region formed therein and adjacent to said first base region; and a surface contact disposed on said substrate, said surface contact coupled to a voltage bias generated by said voltage source, said voltage bias being greater then said first voltage threshold, whereby said first collector voltage is prevented from dropping below said first voltage threshold due to energetic particle induced charge.

2. The bipolar device hardened against single event upset as recited in claim 1, wherein said substrate includes a surface substrate tie disposed under said surface contact.

3. The bipolar device hardened against single event upset as recited in claim 1, wherein said first base region includes an epitaxial region disposed between said first collector region and said first emitter region.

4. The bipolar device hardened against single event upset as recited in claim 3, wherein said epitaxial region is formed from a heterojunction material.

5. The bipolar device hardened against single event upset as recited in claim 4, wherein said epitaxial region is Germanium.

6. The bipolar device hardened against single event upset as recited in claim 1, wherein said bipolar device is a heterojunction bipolar transistor.

7. The bipolar device hardened against single event upset as recited in claim 1, wherein said voltage bias does not forward bias said bipolar device.

8. The bipolar device hardened against single event upset as recited in claim 1, further comprising:

a second collector region formed in said substrate a first distance from said first collector region, said second collector region having a second collector voltage and a second voltage threshold, whereby when said second collector voltage drops below said second voltage threshold said attached bipolar device becomes upset, said substrate having a second base region formed therein and adjacent to said second collector region, said substrate having a second emitter region formed therein and adjacent to said second base region; and said surface contact coupled to said voltage bias, said voltage bias being greater then said second voltage threshold, whereby said second collector voltage is prevented from dropping below said second voltage threshold due to energetic particle induced charge.

9. The bipolar device hardened against single event upset as recited in claim 8, wherein said surface contact is positioned on said substrate between said first collector region and said second collector region.

10. The bipolar device hardened against single event upset as recited in claim 1, further comprising:

said first emitter region having a first emitter voltage and a first emitter voltage threshold, whereby when said first emitter voltage drops below said first emitter voltage threshold said attached bipolar device becomes upset; and said surface contact coupled to said voltage bias, said voltage bias being greater then said first emitter voltage threshold, whereby said first emitter voltage is prevented from dropping below said first emitter threshold due to energetic particle induced charge.

* * * * *